United States Patent [19]

Hoopman et al.

[11] Patent Number: 5,317,805
[45] Date of Patent: Jun. 7, 1994

[54] METHOD OF MAKING MICROCHANNELED HEAT EXCHANGERS UTILIZING SACRIFICIAL CORES

[75] Inventors: Timothy L. Hoopman, River Falls, Wis.; Harlan L. Krinke, Marine, Wash.

[73] Assignee: Minnesota Mining and Manufacturing Company, St. Paul, Minn.

[21] Appl. No.: 20,007

[22] Filed: Feb. 17, 1993

Related U.S. Application Data

[63] Continuation of Ser. No. 875,059, Apr. 28, 1992, abandoned.

[51] Int. Cl.[5] .................................... B23P 15/26
[52] U.S. Cl. ........................... 29/890.03; 29/527.2
[58] Field of Search ............. 29/890.03, 527.2, 527.6; 164/34, 35, 732

[56] References Cited

U.S. PATENT DOCUMENTS

| | | | |
|---|---|---|---|
| 2,137,806 | 11/1938 | Paige | 204/5 |
| 2,365,670 | 12/1944 | Wallace | 204/9 |
| 2,365,690 | 12/1944 | Fassin | 242/71 |
| 2,540,805 | 2/1951 | Beebe | 204/242 |
| 2,898,273 | 8/1959 | Forge, Jr. et al. | 204/9 |
| 3,021,241 | 2/1962 | Schneiderman et al. | 156/173 |
| 3,109,485 | 11/1963 | Fortier | 165/1 |
| 3,277,957 | 10/1966 | New et al. | 29/890.03 |
| 3,329,588 | 7/1967 | Mears | 204/9 |
| 3,332,858 | 7/1967 | Bittinger | 204/11 |
| 3,445,348 | 5/1969 | Aske | 204/9 |
| 3,669,849 | 6/1972 | Schmidt | 204/11 |
| 3,843,910 | 10/1974 | Ringuet | 317/100 |
| 3,980,747 | 9/1976 | Nakagawa et al. | 264/221 |
| 4,133,369 | 1/1979 | Maine et al. | 164/132 |
| 4,285,779 | 8/1981 | Shiga et al. | 204/9 |
| 4,295,282 | 10/1981 | Fox | 34/27 |
| 4,312,687 | 1/1982 | Sigworth, Jr. | 156/245 |
| 4,378,626 | 4/1983 | Eitel | 29/527.2 |
| 4,399,484 | 8/1983 | Mayer | 361/382 |
| 4,401,520 | 8/1983 | Steppan et al. | 204/11 |
| 4,421,153 | 12/1983 | Wilkinson et al. | 164/34 |
| 4,434,835 | 3/1984 | Willgoose | 164/34 |

(List continued on next page.)

FOREIGN PATENT DOCUMENTS

0124428A1 7/1984 European Pat. Off. .

OTHER PUBLICATIONS

Appl. Phys. Lett. 53 (12), Sep. 19, 1988, American Institute of Physics, Mundinger et al. "Demonstration of high-performance silicon microchannel heat exchanger for laser diode array cooling".

(List continued on next page.)

Primary Examiner—Irene Cuda
Attorney, Agent, or Firm—Gary L. Griswold; Walter N. Kirn; Mark W. Binder

[57] ABSTRACT

A method of making a unitary channeled heat exchanger wherein the unitary heat exchanger is to be connected with a first fluid circulation system. The unitary heat exchanger preferably includes a first manifold connectible to the first fluid circulation system and a heat transfer body fluidically connected to the manifold. The unitary heat exchanger is fabricated by forming a sacrificial core with a first manifold forming portion and a body forming portion having surfaces shaped generally similar to the desired shapes of the first manifold and body of the unitary heat exchanger, depositing heat exchanger forming material about the sacrificial core to form a shell about the sacrificial core, the shell preferably including a manifold and a body integrally formed, providing an access opening through the shell of the unitary heat exchanger, and removing the sacrificial core from within the shell of the unitary heat exchanger through the access opening, thereby leaving passages within the manifold and the body of the unitary heat exchanger that are in fluidic communication with one another. The body forming portion of the sacrificial is further preferably made with one or more holes so that upon deposition of heat exchanger forming material, posts are formed connecting upper and lower plates of the shell of the heat exchanger for increased structural integrity. Additionally, the deposition can be advantageously controlled so that apertures remain after the post or posts are formed, which may be used for mounting components or as part of a second fluid circulation circuit.

31 Claims, 4 Drawing Sheets

U.S. PATENTS DOCUMENTS

| | | | |
|---|---|---|---|
| 4,450,472 | 5/1984 | Tuckerman et al. | 357/82 |
| 4,480,393 | 11/1984 | Flink et al. | 34/27 |
| 4,535,518 | 8/1985 | Jaqua | 29/157 |
| 4,539,816 | 9/1985 | Fox | 62/87 |
| 4,541,171 | 9/1985 | Buckley | 29/605 |
| 4,567,505 | 1/1986 | Pease et al. | 357/81 |
| 4,569,391 | 2/1986 | Hulzwitt et al. | 165/166 |
| 4,573,067 | 2/1986 | Tuckerman et al. | 357/82 |
| 4,574,451 | 3/1986 | Smashey et al. | 164/34 |
| 4,637,456 | 1/1987 | Niggemann | 165/104 |
| 4,712,158 | 12/1987 | Kikuchi et al. | 361/385 |
| 4,741,385 | 5/1988 | Bergles et al. | 165/1 |
| 4,865,112 | 9/1989 | Schwarb et al. | 164/34 |
| 4,871,623 | 10/1989 | Hoopman et al. | 428/586 |
| 4,880,055 | 11/1989 | Niggemann et al. | 165/167 |
| 4,975,225 | 12/1990 | Vivaldi et al. | 264/28 |
| 5,038,847 | 8/1991 | Donahue et al. | 164/34 |
| 5,070,606 | 12/1991 | Hoopman et al. | 29/890.03 |
| 5,083,373 | 1/1992 | Hamburgen | 29/890.03 |
| 5,095,973 | 3/1992 | Toy | 29/890.03 |

OTHER PUBLICATIONS

"Electroforming A Nickel Structural Shell For A 40,000 Pound Thrust Calorimeter Test Chamber" Glenn Malone, Electroformed Nickel, Inc., pp. 1-11.

"Tiny Turbine Blades Etched Form Silicon", New Trends.

"Fabricating Closed Channel by Electroforming", H. R. Johnson et al., Plating and Surface Fining, May 1975, pp. 456-461.

"Narrow Channel Forced Air Heat Sink", IEEE Transactions on Conponents, Hybrids, And Manufacturing Technology, vol. CHMT-7, No. 1, Mar. 1984, pp. 154-159.

"High-Performance Heat Sinking for VLSI", IEEE Electron Letters, vol. EDL-2, No. 5, May 1981, pp. 126-129.

"Direct Immersion Cooling Techniques for High Density Electronic Packages and Systems", R. E. Simons et al., IBM Corporation, pp. 314-321.

"Soluble Cores: A new Way to Produce Intricate Parts", Mold & Die Corner, PM & E Oct. 1990, pp. 45-45.

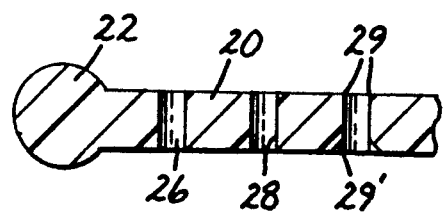
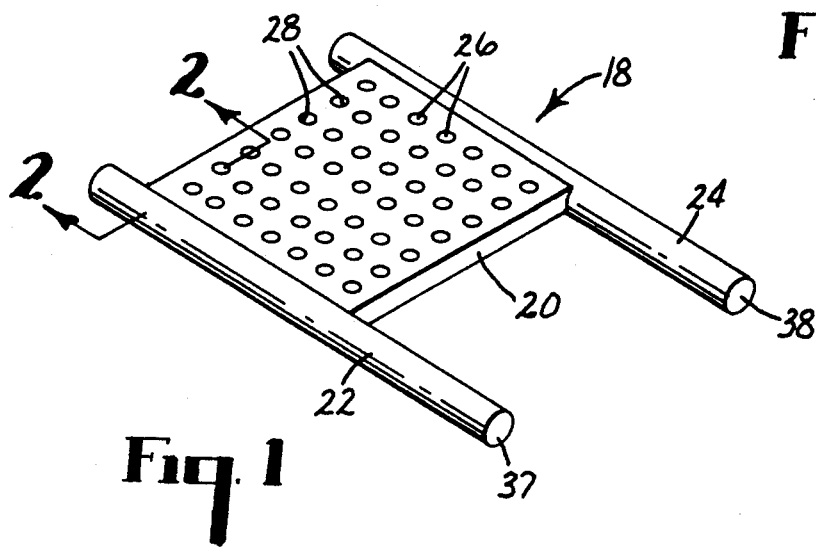
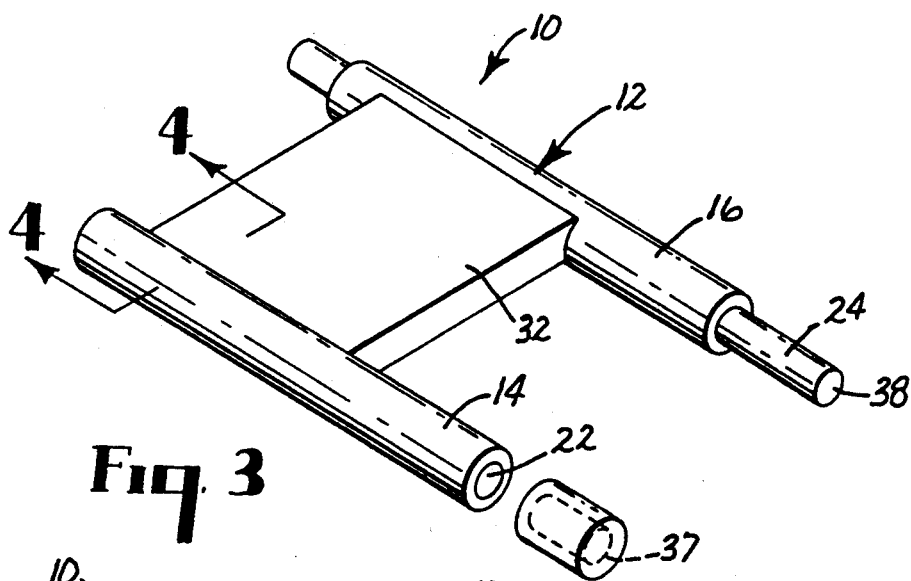
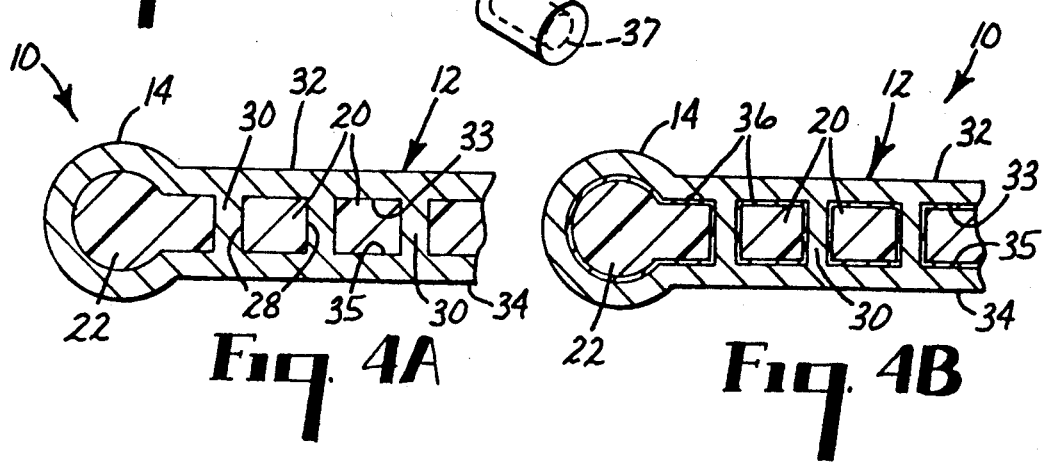

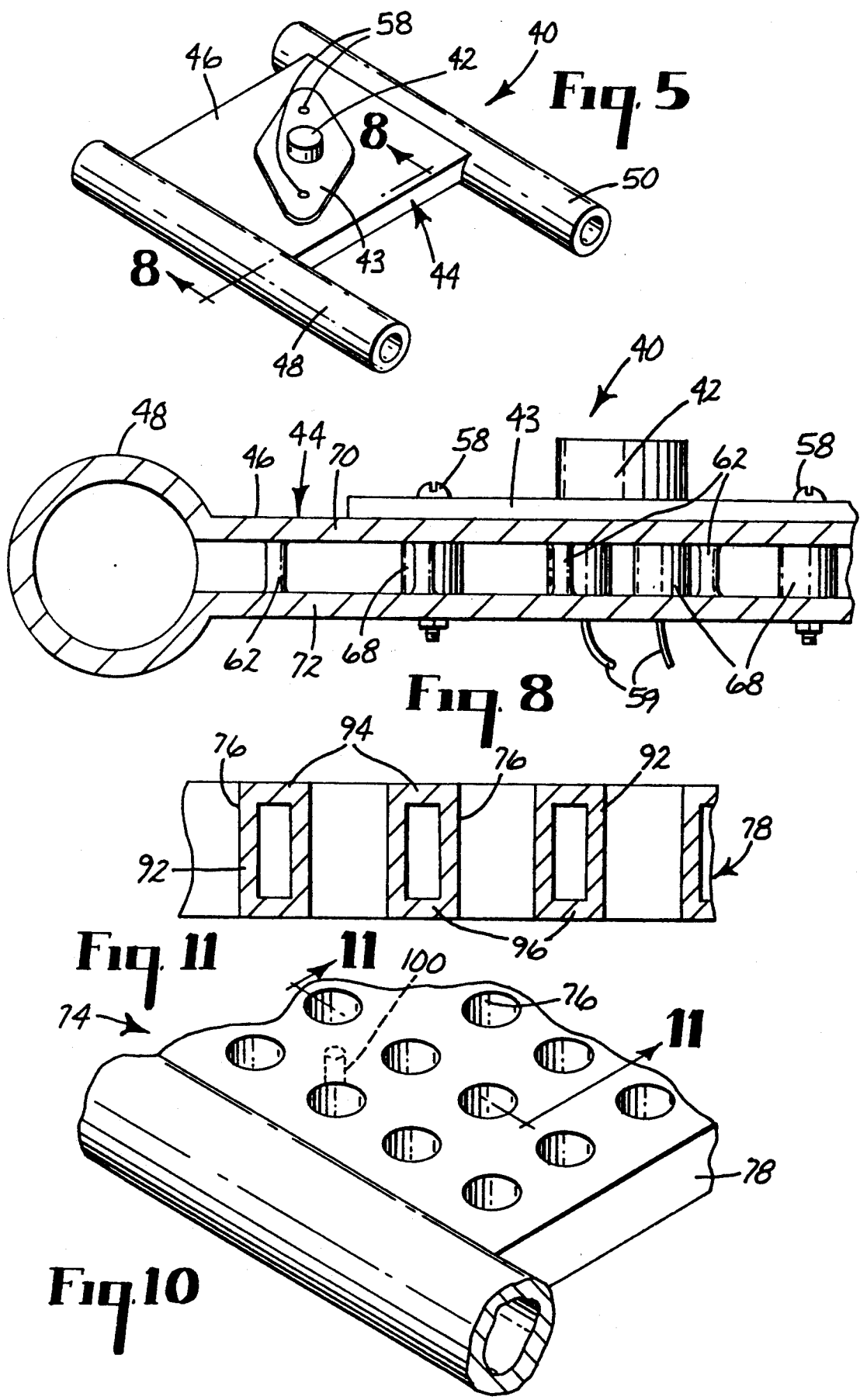

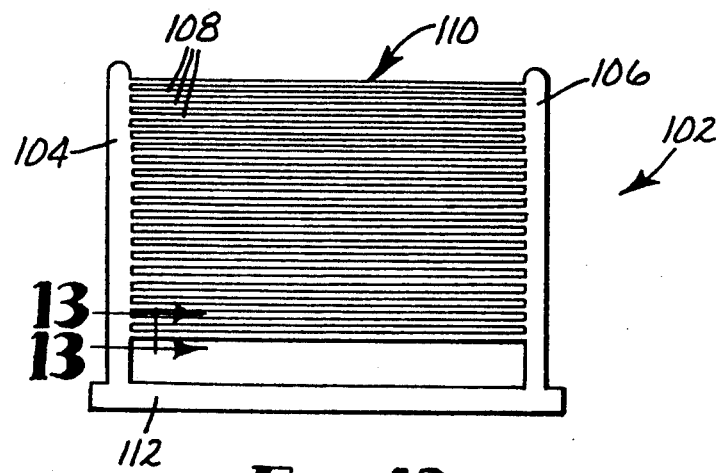
Fig. 12
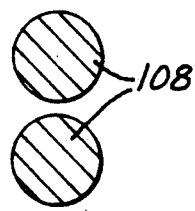  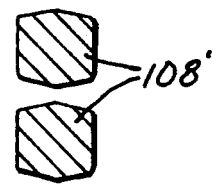  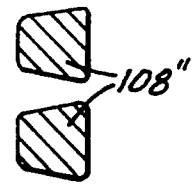
Fig. 13A   Fig. 13B   Fig. 13C
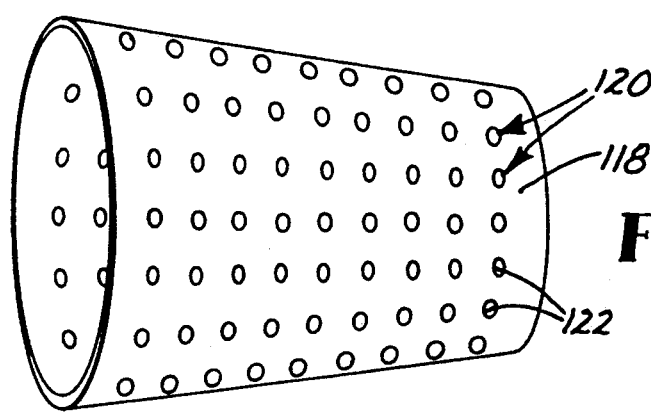
Fig. 15
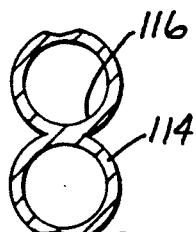  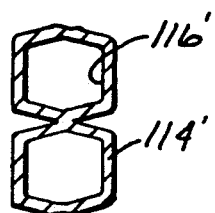  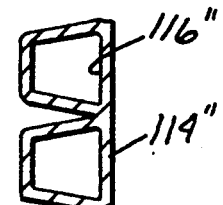
Fig. 14A   Fig. 14B   Fig 14C

METHOD OF MAKING MICROCHANNELED HEAT EXCHANGERS UTILIZING SACRIFICIAL CORES

This is a continuation of application Ser. No. 07/875,059 filed Apr. 28, 1992.

TECHNICAL FIELD

The present invention relates to microchanneled heat exchangers and more particularly to a method of forming microchanneled heat exchangers having a manifold connected with a heat exchanger body.

BACKGROUND OF THE INVENTION

With the development of electronic circuit technologies, particularly microelectronic circuits, which are faster and have denser circuits, there is a continually increasing demand for cooling techniques which can dissipate the continually increasing concentrations of heat produced at the circuit level by integrated circuit chips, microelectronic packages, other components and hybrids thereof. Moreover, such microelectronic circuit technologies require greatly improved heat removal from extremely small circuit components. This situation is worsened when an array of such chips are closely packed to one another. Thus, the density of the chips proportionally increases the heat which must be dissipated effectively by a cooling technique.

In addition to the heat transfer demands on heat exchangers, it is often required that a heat exchanger be designed for a specialized component or use environment, which may involve complex geometries. Such specialized components and environments require specialized heat exchangers.

Cooling techniques have been improved over the recent years in both air cooling applications as well as liquid cooling applications. In either case, it is known to use either cooled forced air or cooled liquid to reduce the temperature of a heat sink device positioned adjacent to the circuit device to be cooled. In another known technique, the circuit chips or packages are cooled by direct immersion cooling, which is the act of directly bringing the chips or packages into contact with the cooling liquid. Thus, no physical walls separate the coolant from the chips. These liquid cooling techniques, either of the heat sink type or direct immersion cooling type, are generally believed to be required in the above described situations with dense very large-scale integration (VLSI) circuits.

One known heat exchanger suitable for use in such an environment is described in U.S. Pat. No. 4,871,623 to Hoopman et al., issued Oct. 3, 1989, which is commonly owned by the assignee of the present invention. The heat exchanger and method described in the Hoopman et al. patent provides a plurality of elongated enclosed electroformed channels that extend through a sheet member between opposing major surfaces. The sheet with the enclosed microchannels is made from a mandrel or master having a plurality of elongated ridges, wherein material is electrodeposited onto the surfaces of the mandrel with the material being deposited on the edges of the ridge portions at a faster rate than on the surfaces defining inner surfaces of the grooves until the material bridges across between the ridge portions to envelope central portions of the grooves and to form the sheet member. Such sheet member includes a base layer with a plurality of elongated projections, each of which extends from the base layer into the grooves of the mandrel, with each of the projections containing an elongated enclosed microchannel. It is also disclosed to then separate the sheet from the mandrel and additionally to use the defined sheet member with its base layer and elongated projections as the mandrel onto which electrodepositing of material again takes place in a similar manner as above thus defining additional elongated enclosed microchannels between the projections of the first formed sheet. The result is a sheet member comprising a microchannel body with a plurality of elongated enclosed channels extending therethrough, wherein the microchannels can have extremely small cross-sectional areas with predetermined shapes.

Another method for producing a suitable heat exchanger comprising a sheet member with a plurality of enclosed microchannels is disclosed in U.S. Pat. No. 5,070,606 issued Dec. 10, 1991, to Hoopman et al., which is also commonly assigned to the assignee of present invention. In this case, the sheet member with the enclosed microchannels is produced by electrodepositing a conductive material about a plurality of fibers with conductive surfaces which are operatively arranged relative to one another to define the enclosed microchannels within the sheet member. Once the electrodepositing step is completed, the fibers are removed by axially pulling the fibers which causes them to experience a reduced diameter as the fibers are stretched during removal from the sheet member. The result is a heat exchanger body having extremely small discrete microchannels passing through the heat exchanger body.

The heat exchangers formed in accordance with the aforementioned Hoopman et al. patents are advantageous in that one piece integrally formed microchanneled heat exchanger bodies are produced. However, both experience a problem in the manifolding of the ends of the microchanneled heat exchanger bodies. In order to manifold these heat exchanger bodies, it is necessary to attach one or both of the open ends of the microchanneled bodies to a tube. The manner of connection has heretofore been accomplished by providing a lengthwise slit in the tubing which accommodates insertion of the open end of the microchanneled body into the interior of the tubing. Then, the joint is silver soldered for sealing the microchanneled body to the tubing. In doing this step, care must be taken so as not to let the solder flow into the ends of the microchannels which could close them.

Other heat exchangers having microchannels which are suitable for cooling electronic circuit components are known which are constructed of plural elements which must be joined together not only to connect a heat exchanger body to a manifold, but also to make up the microchanneled body itself. In one known example, a silicon wafer is fabricated into a microchanneled heat exchanger by sawing into a surface of the silicon with a diamond wafer saw to define a plurality of spaced parallel microgrooves. The silicon wafer is then attached to a substrate which together with the microgrooved wafer define the microchannels. The manifold can be made as a part of the substrate attached to the microgrooved silicon wafer. Other similar heat exchangers including microchannels formed in part by microgrooves made in a silicone wafer or the like are disclosed in U.S. Pat. Nos. 4,450,472, 4,573,067 and 4,567,505 to Tuckerman et al., Tuckerman et al. and Pease et al., respectively. The described manner of forming the microgrooves includes using etching techniques. Additional examples are disclosed in U.S. Pat. No. 4,569,391 to Hulswitt et al., U.S. Pat. No. 4,712,158 to Kikuchi et al., and European Patent application No. EP 0 124 428. Each of these heat exchangers comprise multiple components fabricated into heat exchangers, wherein the plural components are provided in a manner to define the microchannels themselves as well as to make the manifolds.

The present invention specifically relates to the making of a channeled structure by depositing, and more specifically electrochemically depositing, forming material about a sacrificial core, after which the sacrificial core is removed leaving a channeled structure. The general use of sacrificial cores combined with electrochemical deposition is well known. In particular, it is known to electroplate conductive material about sacrificial cores that are inherently conductive as well as sacrificial cores which are rendered conductive by the application of a conductive coating to a non-conductive sacrificial core. Known conductive materials suitable for use as a sacrificial core include those having a low melting point and which are commonly known as fusible metals or alloys. Non-conductive sacrificial cores can be made of various waxes or the like which can be coated with a conductive substance such as silver.

U.S. Pat. No. 4,285,779 to Shiga et al. discloses a fluid circuit device having a base member with a thin sheet integrally electrocast onto the base member, wherein the fluid channels are provided by using a sacrificial core technique. Specifically, strips of soluble substance, such as a low temperature fusing alloy or wax, are applied onto a surface of the base plate. Then, the base plate as well as the strips of soluble material are electroplated. Lastly, the soluble substance is removed leaving an integral channeled circuit device. The fluid circuit device, however, is fabricated as a control device through which fluid signals can be transmitted by way of openings provided through the base member and into the various formed channels, and is not at all concerned with fabricating a heat exchanger and the manifolding of a microchanneled structure. Moreover, the fluid circuit device relies on the base member with precisely located openings as a necessary component of the fluid circuit device.

Other examples of channeled structures made by the electrochemical deposition of conductive material about sacrificial cores which are removed after the electrodeposition step are disclosed in U.S. Pat. Nos. 2,365,690 to Wallace; 2,898,273 to La Forge, Jr. et al.; and 3,445,348 to Aske. These patents are generally related to structures having cavities formed and opened using a sacrificial core technique and are not at all concerned with a heat exchanger connectable to a fluid circuit by a manifold.

A manner for providing orifice openings in an article formed by electrochemical deposition is disclosed in U.S. Pat. No. 3,332,858 to Bittinger. In this case, a removable core is formed out of a silicon material with projections extending from a flat surface thereof which are to be electroplated and by which orifices are to be formed. The surface including the projections is electroplated with conductive material to form the final article which is a spinneret. By plating over the projections, the electroplated material defines protuberances on the outer face of the article which can then be ground away from the article leaving orifices through that face of the spinneret. The core, however, must be wholly removed; so it is necessary that a complete side of the formed article be left open.

SUMMARY OF THE PRESENT INVENTION

The present invention overcomes the deficiencies and shortcomings associated with the prior art in that a method of making a unitary heat exchanger is provided including a channeled heat exchanger body and an integrally formed manifold connectable to a fluid circulation circuit. Additionally, the present invention is directed to a method of making a unitary heat exchanger wherein the heat exchanger body portion is formed with structural posts which greatly increase the structural integrity of the heat exchanger body.

In general, microchanneled heat exchangers are well suited in situations where greater heat dissipation is required particularly with small components such as electronic chips, packages and other components. The ability to meet the cooling demands of such components advantageously increases the output and life expectancy of these components. Moreover, smaller heat exchangers drastically reduce the overall size of the device containing such electronic components. Microchannels are particularly advantageous in that they improve the heat transfer capacity by increasing heat transfer coefficients, greatly reduce heat transfer dimensions, and decrease the distance that heat is to be conducted for dissipation. Moreover, and in accordance with the present invention, complex geometries of heat exchanger design can be fabricated so as to effectively meet the cooling demands of almost any shaped component or other medium requiring a specific heat exchanger geometry.

The method according to the present invention comprises the steps of forming a sacrificial core to have at least a first manifold portion and a body portion which will define the interior surfaces and passageways of the first manifold and body of the heat exchanger. Next, article forming material is deposited about the sacrificial core to at least partially surround and form a shell about the sacrificial core. The result is an integral first manifold and body of the unitary heat exchanger. Next, at least one access opening is provided through the shell to provide access to the sacrificial core from outside of the shell. Then, the sacrificial core is removed from within the shell by way of the access opening, thereby leaving the passages within the integral first manifold and body of the heat exchanger in fluidic communication with one another as defined by the external surfaces of the sacrificial core.

The method of the present invention is also directed to the method of forming such a unitary heat exchanger connectable to a fluid circulation system by forming a sacrificial core with a body portion of a shape to define the interior surfaces and passageways of the body of the unitary heat exchanger. The core is provided with at least one internal surface which defines a hole through the body portion of the sacrificial core. Then, when article forming material is deposited about the sacrificial core to form a shell about the sacrificial core, the article forming material is also deposited onto the internal surface of the body portion so as to create a post of article forming material connecting opposite sides of the shell. Then, when an access opening is provided through the shell and the sacrificial core is removed from within the shell, a unitary heat exchanger body results with at least one post connecting opposite sides of the shell. This results in a general overall increase in the structural integrity of the integral heat exchanger body. Preferably, a plurality of such posts are formed arranged in a pattern to optimize structural integrity.

Furthermore, it is an advantage of the present invention that the size of the hole or holes provided in the sacrificial core can be chosen with respect to the conditions under which the deposition of forming material is conducted and controlled so that apertures remain within one or more of the posts. Such apertures can be beneficially used for mounting a component directly to the heat exchanger, or may define a second fluid circuit through which a second fluid medium can pass in heat transfer relationship with a first fluid circuit including the interior of the heat exchanger body of the present invention.

The method of fabricating a heat exchanger in accordance with the present invention avoids the use of laminations in order to produce a structurally sound and dependable heat exchanger and manifold. Moreover, the channel walls within the heat exchanger body can be structured to cause turbulence of the heat transfer fluid as it flows therethrough in order to enhance heat exchange. Such structured surfaces can be provided by forming complimentary structured surfaces on the body forming portion of the sacrificial core and may include, for example, grooves, ridges or other structures on one or more of the surfaces of the body forming portion. Relatively high fluid pressures can be utilized within the heat exchanger of the present invention with a decreased risk of rupture or any circuit destruction caused by the high pressure. This also reduces the fluid flow requirements for effective heat transfer. Furthermore, the heat exchanger of the present invention can be customized for specific applications with designs limited primarily by the ability to form the sacrificial core and also by the ability to deposit forming material thereon. Furthermore, customized heat exchangers can be designed for specific heat dissipation applications by forming the microchannels to optimize the thermal and hydraulic properties of the fluid of choice, the pressure/flow characteristics of the pumping system, and a desired heat transfer rate.

BRIEF DESCRIPTION OF THE DRAWINGS

The present invention will be further described below with reference to the accompanying drawings, wherein plural embodiments in accordance with the present invention are illustrated and described, in which, FIG. 1 is a perspective view of a sacrificial core including a body forming portion and first and second manifold forming portions;

FIG. 2 is a cross-sectional view taken along line 2—2 in FIG. 1 through a first manifold forming portion and the body forming portion of the sacrificial core;

FIG. 3 is a perspective view of a unitary heat exchanger including a heat exchanger body and first and second manifolds formed about the sacrificial core of FIG. 1;

FIG. 4A is a cross-sectional view taken along line 4—4 in FIG. 3 illustrating the first manifold and body of the unitary heat exchanger formed about the first manifold forming portion and body forming portion of the sacrificial core;

FIG. 4B is a cross-sectional view taken along line 4—4 in FIG. 3 which is similar to FIG. 4A except that a conductive layer is shown additionally provided between the material of the sacrificial core and the unitary heat exchanger;

FIG. 5 is a perspective view similar to FIG. 3 but after the sacrificial core has been removed and with an electronic component shown mounted to the body of the unitary heat exchanger;

FIG. 8 is a cross-sectional view taken along line 8—8 in FIG. 5 with the sacrificial core removed showing the formed posts and manner of mounting the electrical component to the heat exchanger body;

FIG. 10 is a partial perspective view of a unitary heat exchanger including a manifold and a body which is formed from the sacrificial core illustrated in FIG. 9 leaving a combination of closed posts and posts with apertures which can be used as a second fluid path through the body of the unitary heat exchanger;

FIG. 11 is a partial cross-sectional view taken along line 11—11 in FIG. 10 illustrating two fluid flow paths which are in heat transfer relationship with one another;

FIG. 12 is a plan view of yet another embodiment of a sacrificial core which is formed in accordance with the present invention;

FIG. 13A is a partial cross-sectional view taken along line 13—13 in FIG. 12 showing an example of the cross-sectional shape of the discrete microchannel forming portions making up the body forming portion of the sacrificial core;

FIG. 13B is a view taken along line 13—13 in FIG. 12 showing another example of the cross-sectional shape of the microchannel forming portions making up the body forming portion of the sacrificial core;

FIG. 13C is another view taken along line 13—13 in FIG. 12 showing a third example of the cross-sectional shape of the microchannel forming portions making up the body forming portion of the sacrificial core;

FIG. 14A is a cross-sectional view of the microchannels that are formed about the sacrificial core of FIG. 13A after the sacrificial core is removed;

FIG. 14B is a cross-sectional view of the microchannels that are formed about the sacrificial core of FIG. 13B after the sacrificial core is removed;

FIG. 14C is a cross-sectional view of the microchannels that are formed about the sacrificial core of FIG. 13C after the sacrificial core is removed; and FIG. 15 is another embodiment of a sacrificial core formed in the shape of a truncated cone.

DETAILED DESCRIPTION OF THE PREFERRED EMBODIMENTS

Figure 6:
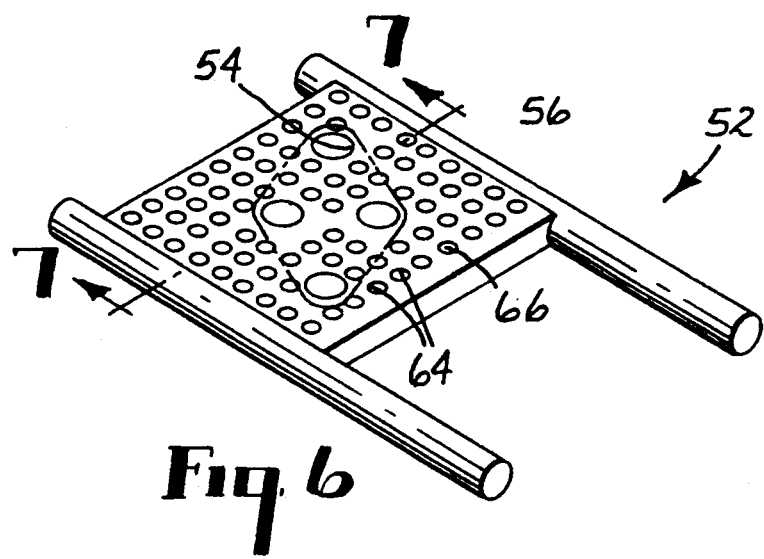
FIG. 6 is a perspective view of the sacrificial core used to make the unitary heat exchanger illustrated in FIG. 5 with the expected position of such electronic component shown by the dashed line.
Figure 7:
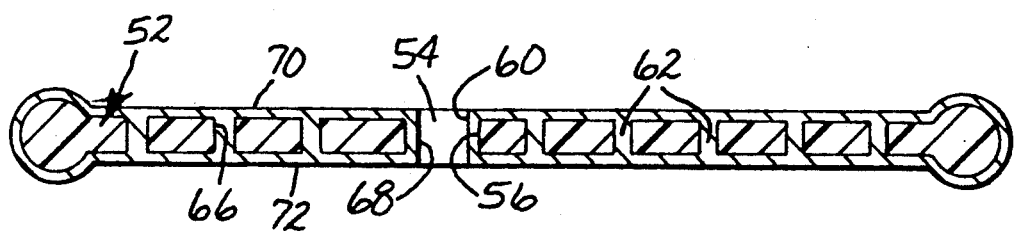
FIG. 7 is a cross-sectional view taken along line 7—7 in FIG. 6 but further with a unitary heat exchanger formed as a shell about the sacrificial core including a combination of posts and apertures.

Referring now to the drawings, wherein like numerals are used to designate like components throughout the several figures, and initially to FIGS. 1-4, illustrated is a unitary heat exchanger 10 comprising a heat exchanger body 12, a first fluid manifold 14, and a second fluid manifold 16. The first and second manifolds 14 and 16, respectively, are connectable to a fluid source or reservoir as part of a first fluid circuit through which a heat transfer fluid is circulated. The unitary heat exchanger 10 can be used as a heat source or as a heat sink for heating or cooling a component or other medium positioned adjacent to or flowing next to the unitary heat exchanger 10.

The heat exchanger body 12 is integrally made with and of the same material as the first and second manifolds 14 and 16 by the method of the present invention described below. Moreover, the heat exchanger body 12 constitutes the primary heat exchanger which supplies heat to or accepts heat from a component or other medium. In the embodiment illustrated in FIG. 3, the heat exchanger body 12 is generally planar, although many other shapes are contemplated as emphasized below. Passages within the heat exchanger body 12 also comprise parts of the first fluid circuit through which a heat transfer fluid is circulated as it passes between the first manifold 14 and the second manifold 16.

In order to define the passages within the heat exchanger body 12, first manifold 14 and second manifold 16, in accordance with the method of the present invention, a sacrificial core 18, shown in FIG. 1, is used. The external shape of the sacrificial core 18 is generally similar to the overall shape of the unitary heat exchanger 10. More particularly, the sacrificial core 18 includes a heat exchanger body forming portion 20, a first manifold forming portion 22, and a second manifold forming portion 24. The external surfaces of the heat exchanger body forming portion 20, first manifold forming portion 22 and second manifold forming portion 24 define the interior surfaces of the passages defined within the heat exchanger body 12, first manifold 14 and second manifold 16, respectively.

The sacrificial core 18 can be formed as a single unit, or may be made up of separate elements adhered, fused or otherwise fixed together. Specifically, the sacrificial core 18 including body forming portion 20 and manifold forming portions 22 and 24 can be formed as a unit by a molding process of the entire sacrificial core or can be made separately and then fixed together by melt fusing or with adhesive. For example, the first and second manifold forming portions 22 and 24 can be formed together in one piece as part of a larger supporting structure (i.e., U-shaped or rectangular), and the body forming portion 20 can then be positioned on and joined to the first and second manifold forming portions 22 and 24 by melting and fusing the components together at such joints.

Suitable materials used for the sacrificial core 18 include waxes, plastics and fusible metals or alloys. Specifically, examples of suitable waxes include "Machinable Wax" available from Freeman Manufacturing and Supply Company of Cleveland, Ohio and "Tuffy" injection wax available from Kerr Manufacturing Company of Romulus, Michigan. An example of a suitable plastic is a polyacetal sold by E. I. DuPont de Nemours and Company of Wilmington, Del. under the trademark "DELRIN". Fusible or low melting point metals include the fusible alloys sold under the trademark "INDALLOY" sold by Indium Corporation of America of Utica, New York, particularly "INDALLOY 255" and "INDALLOY 281". It is understood that many other waxes, plastics, and metals could be used provided that they can be melted, dissolved or decomposed without substantially harming the material of the heat exchanger formed about the sacrificial core as described below.

In accordance with one example of a method for making the sacrificial core 18, a piece of blue "Machinable Wax" from Freeman Manufacturing and Supply Company was formed into a thin wax sheet between heated glass panes. The wax sheet was then cut into an appropriate size to form the heat exchanger body forming portion 20. The size, of course, depends on the end use of the heat exchanger. Next, the cut sheet portion was placed in proper location on an aluminum mold which defines the first and second manifold forming portions 22 and 24. The mold was clamped together and molten green "Tuffy" wax from Kerr Manufacturing Co. was poured into the mold until full. Then, after cooling, the entire sacrificial core 18 was removed from the mold including body forming portion 20 fused together with the first and second manifold forming portions 22 and 24.

It is, however, understood that any suitable wax or plastic or combinations and blends thereof could be simply formed into the entire sacrificial core 18 by a single molding step, such as by conventional injection molding techniques. Moreover, when using a fusible alloy, it is preferable to mold the fusible alloy into the sacrificial core 18 by a single molding step. Alternatively, the sacrificial core 18 could be made by a machining process, wherein a block of suitable wax, plastic or fusible metal could be machined down to the desired core shape.

Referring again to FIGS. 1 and 2, the heat exchanger body forming portion 20 of the sacrificial core 18 is further provided with a plurality of through holes 26. The through holes 26 are defined by internal surfaces 28 of the core material forming the body forming portion 20. As seen in FIG. 1, the through holes 26 are arranged in accordance with a predetermined pattern, the reason for which will be apparent with the description of the formation of the unitary heat exchanger 10 below. Furthermore, the through holes 26 and thus the internal surfaces 28 can be made by drilling or otherwise machining through the body forming portion 20 after the formation of the sacrificial core 18 as described above. Alternately, the through holes 26 can be formed during the formation of the body forming portion 20 either before or during formation of the first and second manifold forming portions 22 and 24. In any case, to form the through holes 26 during a molding step, the mold used for forming the body forming portion 20 is provided with elements having external surfaces that correspond to the internal surfaces 28 on the body forming portion 20.

After the sacrificial core 18 is fully formed, the unitary heat exchanger 10 is formed about the sacrificial core 18. Then, the sacrificial core 18 is removed. In accordance with the present invention, the unitary article 10 is formed by a deposition step. Deposition is defined as the controlled formation of material on an article from the ambient solution, gases or mixtures thereof within which the article is located. Deposition includes electrochemical, chemical and physical techniques and the like. Chemical deposition means techniques for depositing body forming material as a result of a chemical reaction, such as by chemical vapor deposition (CVD). Physical techniques include deposition methods such as spraying or sputtering techniques or the like. Preferably, electrochemical plating is utilized.

Electrochemical plating is defined as the deposition of a continuous layer of material onto an article by the interaction in solution of a metal salt and supplied electrons which are the reducing agent of the metal salt. One type of electrochemical plating is known as electroless plating within which the electrons supplied for reduction of the metal salt are supplied by a chemical reducing agent present in the solution. Another type of electrochemical plating is known as electrolytic plating, or more commonly as electroplating, wherein the electrons used for reduction of the metal salt are supplied by an external source such as a battery, generator or other DC power supply including rectifiers of AC current. In electroplating, the object to be plated must have or be provided with a conductive surface. Furthermore, conventionally known pulse plating techniques can be optionally used where periodic reversals of the current flow direction can be controlled to enhance electroplating of certain metals, particularly with copper.

A major advantage of electroless plating is that certain metals can be plated on properly prepared non-conductors as well, as further described below. The most common metals that can be deposited by electroplating or by electroless plating are nickel, copper, gold and silver; however, many other known metals, alloys, compounds and composites are also known to be capable of deposition by electrochemical plating. The formation of a self-supporting structure by electrochemical plating, such as the unitary heat exchanger 10 of the present invention, is hereinafter referred to as electroforming.

Referring again to FIGS. 3, 4A and 4B, the unitary heat exchanger 10 is formed, preferably electroformed, substantially completely about the sacrificial core 18 so as to substantially envelope the sacrificial core 18 and to form the unitary heat exchanger 10 with a shape generally similar to the shape of the sacrificial core 18. Moreover, the heat exchanger body 12 is integrally formed at the same time with the first and second manifolds 14 and 16, and of the same material. Furthermore, the forming material is also deposited on the internal surfaces 28 of the body forming portion 20 of the sacrificial core 18.

The result of such deposition of forming material within the through holes 26 is a plurality of posts 30 that integrally connect the upper plate 32 and the lower plate 34 of the heat exchanger body 12. The number of posts 30 corresponds to the number of through holes 26 defined by internal surfaces 28. This formation of the posts 30 at the same time as the formation of the heat exchanger body 12 and first and second manifolds 14 and 16 results in an integral structure that exhibits a greatly improved strength and which can accommodate substantially higher fluid pressures than that of multi-component heat exchangers. Furthermore, the number of and pattern of the posts 30 can be chosen for specific strength characteristics.

When electrochemical deposition is used to electroform the unitary heat exchanger 10, such electrochemical deposition, particularly with electroplating, may result in forming material being deposited more rapidly at sharp edges of the sacrificial core 18 than at other portions. Thus the opposed corner edges 29 of internal surfaces 28 may have a tendency to be electroplated faster than the remainder of the internal surfaces 28 depending on the rate of deposition. The result could be posts 30 which are closed at the bottoms and tops thereof but which are hollow in the center. It has been found that slower rates of deposition reduce the possibility of hollow posts. Moreover, the edges 29 can be chamfered or rounded as shown in FIG. 2 at 29, to reduce the formation of hollow posts 30 and to increase post strength.

Another important advantage associated with the posts 30 is that the posts 30 enhance heat transfer by providing additional surface area with the heat exchanger body 12 and by causing more turbulent fluid flow within the heat exchanger body 12. Further in this regard, it is also contemplated to increase turbulent fluid flow to enhance heat transfer by structuring the internal surfaces 33 and/or 35 of plates 32 and 34. By structuring, it is meant the formation of grooves, ridges or other structures (regular or not) on one or both of surfaces 33 or 35 which will tend to break up the fluid flow between plates 32 and 34. In the same sense, the posts 30 can be formed of other shapes than cylindrical or may be provided on the surfaces thereof with structuring. In any case, whether the structuring is provided on the internal surfaces 33, 35 and/or the posts 30, such structuring can be easily provided by forming complimentary structures on the surfaces of the sacrificial core 18. Specifically, such ridges, grooves or other structures can be formed on the surfaces of the body forming portion 20 or the internal surfaces 28 thereof. Such formation may be done during molding of the sacrificial core 18 or thereafter by a machining process, or the like.

As mentioned above, the sacrificial core 18 may comprise a wax, plastic, fusible alloy or the like. If the method of deposition of forming material used to form the unitary heat exchanger 10 is electroplating, then it is necessary that the outer surface of the sacrificial core 18 onto which the forming material is to be deposited be conductive. In the case of using a non-conductive wax or plastic sacrificial core, it is first necessary to render the external surface thereof conductive. One manner of rendering the external surface conductive is to treat the surface to form a thin conductive layer thereon. This is conventionally done by applying a very thin layer of a conductor such as silver on the external surface of those portions of the sacrificial core 18 onto which deposition will take place. Any of the known conventional layering or coating techniques can be utilized to provide a thin conductive layer including painting, spraying or an initial use of electroless plating. Thereafter, electroplating can be conducted as if the sacrificial core 18 were totally metallic. If electroless plating is to be utilized as the manner of forming the entire unitary heat exchanger 10, then it may not be necessary to first render conductive the sacrificial core 18. Proper electroless plating may require certain surface preparation steps, which are well known, and which may vary depending on the metal to be deposited and the core forming material. Typical steps include, in order, treatment with an etchant, a neutralizer, a catalyst, an accelerator and then the electroless metal bath.

As shown in FIG. 4B, the sacrificial core 18 including the body forming portion 20 and first manifold forming portion 22 are coated with a conductive layer 36 when it is necessary to render the external surfaces thereof conductive for plating by the electroplating method. In contrast, FIG. 4A represents the combination of the unitary heat exchanger 10 and the sacrificial core 18 without the need for an additional conductive layer when electroless plating is used as the manner of electrochemical deposition or if the sacrificial core 18 comprises a conductive material such as a fusible alloy, or if other deposition techniques are to be used. As above, if electroless deposition is to be conducted, other surface treatments may be required.

Although it is preferable that electrochemical deposition be used to make the heat exchangers according to the present invention, it is contemplated that other deposition techniques could be used. For example, some metals, such as nickel, are known to be capable of deposition onto an article by chemical vapor deposition (CVD) methods. Moreover, other non-metals could be used and deposited by a CVD method if the material is strong enough to withstand the fluid pressures and heat of a specific application.

After the forming material is deposited onto the sacrificial core 18 and the unitary heat exchanger 10 is formed, the sacrificial core 18 must be removed. In order to prepare for the removal of the sacrificial core 18, some access must be provided from external of the shell forming the unitary heat exchanger 10 to the passages formed within the unitary heat exchanger 10 by the sacrificial core 18. One manner to do this, as shown in FIG. 3, is to control the deposition of forming material onto the sacrificial core 18 such that at least a portion of one of the first or second manifold forming portions 22 or 24 of the sacrificial core 18 is not covered by the forming material. In other words, at least a portion of one of the manifold forming portions 22 or 24 remains free of forming material after the deposition step is complete and the unitary heat exchanger 10 is fully formed. As seen in FIG. 3, an end 38 of manifold forming portion 24 is shown free of forming material.

This can be done in a variety of ways. If the sacrificial core 18 is made of a non-conductive material such as a wax or plastic and electroplating is to be used as the deposition step, then by simply not coating a portion of the manifold forming portion 22 or 24 with a conductive layer, such portion will remain free of forming material. In the cases where the sacrificial core 18 is conductive or rendered conductive and electroplating is to be used or where electroless deposition or another chemical or physical deposition method is to be used on a conductive or nonconductive sacrificial core 18, then it may be desirable to positively treat such a portion of the manifold forming portions 22 or 24 so as to prevent deposition of forming material thereon. This can be done by wrapping or otherwise coating such a portion with a tape or coating of material that will prevent the deposition of forming material thereon. When using electroless deposition, it is necessary to wrap with a tape or to coat that portion with any one of known materials onto which electroless deposition does not easily deposit. In the case of electroplating a conductive sacrificial core 18, it is preferred to use a non-conductive tape to provide the at least one portion to which forming material is not deposited. It is, however, contemplated that any other non-conductive coating, paint or the like could be used instead. Moreover, it is preferred that more than one access opening be provided by controlling the deposition so that a plurality of sacrificial core portions remain after deposition that are free of forming material. More preferably, it is desirable that such portions free of forming material be provided at both ends of each of the manifold forming portions 22 and 24.

Another manner of providing the needed access opening through the shell of the unitary heat exchanger 10 is also illustrated in FIG. 3, which is used when the manifold forming portions 22 and 24 including ends thereof 37 and 38, respectively, are entirely covered by forming material. The access opening is provided by removing the forming material from at least one of, and preferably all of, the ends 37 or 38. This removal can be easily done by simply cutting away a portion of the manifolds 14 or 16 (as illustrated in FIG. 3 where a portion of first manifold 14 is cut away) including the ends 37 and/or 38. Other means for providing an access anywhere along the first or second manifolds 14 or 16 such as grinding, drilling or the like are also contemplated.

No matter how the access opening or openings are provided through the shell of the unitary heat exchanger 10, the step of removing the entire sacrificial core 18 follows. The preferred manner of removing the sacrificial core 18 is by heating the unitary heat exchanger 10 including the sacrificial core 18 to a temperature above the melting point of the sacrificial core 18 but below the melting point of the forming material making the unitary heat exchanger 10. The forming material of the unitary heat exchanger is preferably nickel or copper. Thus, the choice of materials for the sacrificial core 18 is dictated by its melting temperature as compared to that of the forming material of the unitary heat exchanger 10. Waxes and plastics such as those noted above are in most cases suitable for such sacrificial core use. Known low melting temperature metals and alloys, also as noted above and known as fusible metals and alloys, also work well.

To accomplish the removing step, the combination of the unitary heat exchanger 10 and sacrificial core 18 are preferably placed in a heated environment or heat is directly applied to the unitary heat exchanger 10. Furthermore, the access opening is preferably provided in a position and held in that position so that the flow of molten sacrificial core material under the influence of gravity will completely drain all of the sacrificial core forming material from within the unitary heat exchanger 10. It is also contemplated that one or more access openings could be connected to a pressurized source or a vacuum to assist in the removal of sacrificial core material.

Alternately, the sacrificial core 18 can be removed by chemically dissolving the sacrificial core 18 in a solution. In that case, the sacrificial core 18 should be comprised of a material which is easily dissolved in solution that will not substantially harm the forming material of the unitary heat exchanger 10. In a similar manner, the material of the sacrificial core 18 can be a material which decomposes as a result of the application of a controlling affect. For example, when the plastic material known as DELRIN, discussed above, is used in forming the sacrificial core 18, the application of heat as the controlling affect causes such material to decompose to formaldehyde which escapes as a gas.

Although the deposition step of forming material to form the unitary heat exchanger 10 can be any known deposition technique in accordance with the above, a specific example of a suitable preferred electroplating technique is described as follows. In one example, the sacrificial core 18 was produced, as above, out of a combination of blue "Machinable Wax" and green "Tuffy" wax. Then, holes were drilled in the heat exchanger body forming portion 20 of the sacrificial core 18 with hole diameters ranging between 0.015 inch and 0.030 inch at a non-staggered spacing of between 0.05 inch and 0.20 inch. Next, the sacrificial core 18 was mounted on a brass turning rod for plating. Then, a silver coating was provided over the entire sacrificial core 18 by electroless deposition for rendering the entire sacrificial core 18 conductive for electroplating. A silver paint was used to touch up the sacrificial core 18, particularly at intersection points. After that, the manifold forming portions 22 and 24 were masked at their ends 37 and 38 with a non-conductive tape so that plating would not occur on those ends.

Thereafter, the sacrificial core 18 and brass turning rod were immersed in a nickel sulfamate bath (not shown) containing 16 ounces/gallon of nickel; 0.5 ounces/gallon of nickel bromide; and 4.0 ounces/gallon of boric acid. Also, 0.1 ounces/gallon of a surfactant, namely "DUPONAL ME" available from E.I. DuPont de Nemours and Company of Wilmington, Del., was added to the bath to prevent $H_2$ bubbles from sticking to the surfaces of the sacrificial core 18 and to thereby minimize gas pitting. The remainder of the plating bath was filled with distilled water. A quantity of S-nickel anode pellets were contained within a titanium basket which was suspended in the plating bath. A woven polyproplyene bag was provided surrounding the titanium basket within the plating bath for trapping particulates. The plating bath was continuously filtered through a 5 micron filter. The temperature of the bath was maintained at 90° F., and a pH of 4.0 was maintained in the plating bath solution. A current density of 10 amps per square foot was applied to the sacrificial core 18 for 48 hours with the sacrificial core 18 and brass turning rod continuously rotated at 6 rpm to enhance uniformity of deposition. The voltage applied to the sacrificial core 18 is a function of the conductivity of the bath to produce the desired amps. Upon removal, a unitary heat exchanger 10 with integral heat exchanger body 12 and first and second manifolds 14 and 16 was produced of nickel having an average thickness of about 24 mils (0.610 mm). As a general rule, at 20 amps per square foot, the nickel is deposited at a rate of approximately 1 mil/hr (0.0254 mm/hr). At 10 amps per square foot, the nickel is deposited at an approximate rate of 0.5 mil/hr (0.0127 mm/hr). Slower formation generally increases strength and improves uniformity of wall thicknesses and posts 30. Moreover, there is less of a tendency for the posts 30 to be formed hollow, as discussed above, when 10 amps per square foot is applied to the sacrificial core 18. Next, the sacrificial core 18 was removed by applying heat directly to the unitary heat exchanger 10 with the access openings that were provided by the masked ends of manifold forming portions 22 and 24 arranged downwardly so that as the sacrificial core 18 was melted, the wax material flowed out of the shell of the unitary heat exchanger 10. As a result, clean passages were provided within the heat exchanger body 12 and first and second manifolds 14 and 16. Moreover, a plurality of posts 30 were formed at each of the locations of the through holes 26 according to the hole diameter and spacing and pattern of through holes 26 drilled within the heat exchanger body forming portion 20 of the sacrificial core 18.

Furthermore, the formed unitary heat exchanger 10 exhibits a greatly improved structurally sound integral unit with the passage of the heat exchanger body 12 in fluidic communication with both the first and second manifolds 14 and 16 without leakage problems. Moreover, the structural integrity is greatly improved by the pattern of posts 30 which strengthen the heat exchanger body 12. This strength is particularly important in that the heat exchanger body 12 can handle heat exchange fluids at relatively high pressures with a minimum of plate deflection. Minimizing plate deflection is critical when using the heat exchanger adjacent to certain components, such as electronic circuitry since deflection could adversely affect the circuitry and could reduce the overall surface contact between the unitary heat exchanger 10 and the component.

A further advantage of such posts 30 is that they improve heat transfer. The posts 30 not only provide additional surface area for contact with the circulated heat exchange fluid, but also cause more turbulent fluid flow of the heat exchange fluid through the heat exchanger body which breaks up boundary layers and thereby enhances heat transfer.

It is also noted, that throughout the illustrations of the Figures, the height of the heat exchanger body 12 with respect to the diameter, in cross-section, of the first and second manifolds 14 and 16 is greatly exaggerated for clarity. That is not to say that the heat exchanger 10 cannot be formed with such a dimensional ratio, but that it is preferable to keep the thickness of the heat exchanger body 12 relatively thin as compared to the size of the passages within the manifolds so that a relatively large amount of heat exchange fluid can be readily available to flow through the heat exchanger body 12 and to easily position the heat exchanger body 12 adjacent to a component or circuitry to be cooled. Further in this regard, the heat exchanger body 12 can advantageously be positioned off center of the plane connecting the axis lines of the first and second manifolds 14 and 16 so that the heat exchanger body 12 can be more easily positioned immediately adjacent to a component.

In operation of the unitary heat exchanger 10 as a heat exchanger, the first manifold 14 is preferably connected to a supply rail (not shown) of heat exchange fluid. The second manifold 16 is also preferably connected to a rail further connected to a drain line (not shown) which is associated with a reservoir (not shown). Heat exchange fluid is conventionally supplied from a source including a pressurizing means such as a pump (not shown) which maintains a sufficient fluid pressure within the supply rail and first manifold 14. The heat exchange fluid then flows through the heat exchanger body 12 at a rate sufficient to heat or cool whatever component the heat exchanger 10 is provided adjacent to, and the heat exchange coolant fluid then exits through second manifold 16 and eventually back to a supply reservoir. If the component is to be cooled by the heat exchanger 10, then it is also necessary to provide a cooling means (not shown) for the heat exchange fluid before the fluid enters the first manifold 14. If the component is to be heated, then a heating means (not shown) must be similarly incorporated.

Referring now to FIGS. 5–8, another embodiment of the present invention is illustrated as a unitary heat exchanger 40 which is formed in substantially the same manner as the unitary heat exchanger 10 described above. Additionally, as shown in FIG. 5, the unitary heat exchanger 40 has an electronic component 42 fixed adjacent to the heat exchanger body 44, and more specifically against a substantially planar surface 46 thereof. The surface 46 may be conventionally machined flat to better contact such component 42 since electroforming may result in some surface unevenness. Such a finishing step may be done in any case, particularly where the unitary heat exchanger 10 is to be placed adjacent to a component. The heat exchanger body 44 is integrally formed with a first manifold 48 and a second manifold 50 in accordance with the method described above with respect to FIGS. 1–4.

In order to form the unitary heat exchanger 40 so as to accommodate the mounting of the electronic component 42 against surface 46, a sacrificial core 52 is fabricated as shown in FIG. 6. As above, the sacrificial core 52 can be made from a wax, plastic, fusible alloy, or the like. The difference between the sacrificial core 52 of the second embodiment as compared to the sacrificial core 18 of the first embodiment is that the sacrificial core 52 is additionally formed with a plurality of large through holes 54 defined by internal surfaces 56. The large through holes 54 correspond to the mounting position of the electronic component 42 as illustrated in dotted lines, and are provided for accommodating mounting elements such as screws or bolts 58 and lead wires of the component 42.

The large holes 54 are dimensioned to be sufficiently large so that during the deposition step of forming material to make the shell of unitary heat exchanger 40, apertures 60 remain through the unitary heat exchanger 40 after deposition is complete. In other words, deposition is ceased when the apertures 60 sill remain. Moreover, at the same time, posts 62 are formed within the smaller through holes 64 defined by internal surfaces 66. Preferably, the posts 62 are closed. Thus, deposition is stopped when the closed posts 62 are formed but while apertures 60 remain. The smaller through holes 64 are arranged in a predetermined pattern to provide strength to the heat exchanger body 44 similarly as in the first embodiment. The apertures 60, however, not only provide structural support by the circumferential walls 68 thereof, but also define a passage through which the screws or bolts 58 and lead wires 59 can pass. The apertures 60 are formed during the deposition step by controlling the thickness of deposited forming material on the sacrificial core 52 such that the posts 62 are adequately formed while leaving apertures 60.

Furthermore, as above, the fabrication is completed by providing at least one access opening through the shell of the unitary heat exchanger 40 and thereafter removing the sacrificial core 52 by melting, dissolving, decomposing or otherwise so as to leave open passages in fluidic communication between the first manifold 48, heat exchanger body 44 and second manifold 50.

As illustrated in FIG. 8, the passages within the first manifold 48 and heat exchanger body 44 are in fluidic communication with one another. A plurality of closed posts 62 are shown connecting an upper plate 70 to a lower plate 72 both of the heat exchanger body 44. The external surface of the upper plate 70 defines the surface 46 against which the electronic component 42 is located. Screws or bolts 58 extend through a mounting plate 43 of the electronic component 42, upper plate 70, one of the apertures 60 defined by a circumferential wall 68, and lower plate 72. A conventional nut or the like is provided on the screw or bolt 58 for securing component 42 in place.

In the illustrated embodiment, two of the apertures 60 are utilized for the passage of screws or bolts 58 so as to mount the component 42 to the heat exchanger body 44 while the other two are used for the passage of lead wires 59 therethrough. In use, heat generated by the electronic component 42 conducts into the heat exchanger body 44 wherein a fluid coolant is circulated for absorbing and transferring away the heat. Any suitable coolant fluid can be used including, but not limited to, air, water, or refrigerants, such as "Fluorinert" which is a trademarked fluorochemical coolant marketed by Minnesota Mining and Manufacturing Company of St. Paul, Minn. It is also understood that the shape and locations of the apertures 60 through the heat exchanger body 44 can be designed in accordance with the needs of a specific electronic component. Moreover, more or less apertures 60 can be provided as necessary for the specific component or components.

Figure 9:
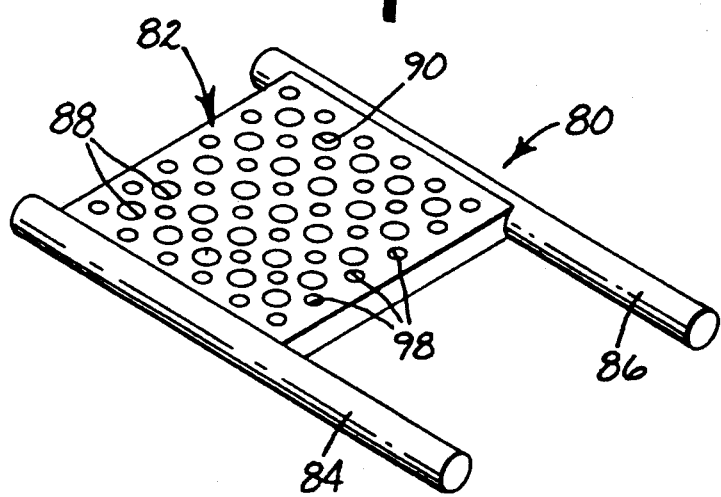
FIG. 9 is a perspective view of yet another sacrificial core designed in accordance with the present invention having plural different sized holes formed in the body forming portion thereof.

Referring now to FIGS. 9–11, yet another embodiment of a unitary heat exchanger 74 is illustrated. This third embodiment is substantially similar to that described above with respect to FIGS. 5–8, except that apertures 76 are formed in a predetermined pattern through the heat exchanger body 78 of the unitary heat exchanger 74. As seen in FIG. 9, a sacrificial core 80 is formed having a heat exchanger body forming portion 82 connected between a first manifold forming portion 84 and a second manifold forming portion 86. Large through holes 88 are provided by drilling or another forming technique through the heat exchanger body forming portion 82 defining internal surfaces 90. During the deposition step, such as electroplating, the large through holes 88 allow forming material to be deposited on the internal surfaces 90 thereof thereby making cylindrical walls 92 connecting between upper and lower plates 94 and 96, respectively, of the heat exchanger body 78. The cylindrical walls 92 define apertures 76 passing through heat exchanger body 78. Of course, apertures can be made other than circular and the walls defining the apertures could likewise be other than cylindrical. The aperture shape and the walls defining the apertures can be selectively controlled by the shape of the internal surfaces 90 defining the through holes 88.

It is also contemplated to further provide a pattern of smaller through holes 98 through the heat exchanger body forming portion 82 of the sacrificial core 80 in combination with the large through holes 88. These smaller through holes 98 are used to make additional posts 100 for increased structural integrity. It is, however, understood that the cylindrical walls 92 may be sufficient for many applications for providing adequate structural rigidity without additional posts 100. In such a case, only the larger through holes 88 would need be provided through the heat exchanger body forming portion 82 of the sacrificial core 80. Likewise, as above, the dimensions of the large through holes 88 and thus of the apertures 76 are chosen so that when deposition, such as electroplating, takes place the thickness of material deposited is controlled so that the apertures 76 remain. The size of the apertures 76 are dependent on the specific application of the apertured unitary heat exchanger 74. Different size apertures can be formed in combination for a specific purpose.

An application of the unitary heat exchanger 74 is as a fluid-to-fluid heat exchanger where a first fluid is circulated through the unitary heat exchanger 74 by way of manifolds and the heat exchanger body 78 while a second fluid medium is passed in one direction through the plurality of apertures 76 formed through the heat exchanger body 78. The fluid circulated within heat exchanger body 78 can be used to cool or heat the fluid medium passing through the apertures 76. One specific application of such a fluid-to-fluid heat exchanger is utilized in the system shown and described in U.S. Pat. Nos. 4,295,282 to Fox, 4,480,393 to Flink et al. and 4,539,816 to Fox, each commonly owned by the assignee of the present invention, and fully incorporated herein by reference. Generally, such a heat exchanger is useful in the described recovery system and apparatus for recovering condensable liquid from a gaseous environment.

Referring now to FIGS. 12–14, yet another type of unitary heat exchanger is illustrated which can be fabricated in accordance with the present invention. A sacrificial core 102, shown in FIG. 12, is used for making a unitary heat exchanger having a plurality of discrete microchannels connected between manifolds as opposed to a common channel between parallel plates as in the embodiments described above. The sacrificial core 102 comprises a first manifold forming portion 104, a second manifold forming portion 106 and a plurality of discrete microchannel body forming portions 108 which together comprise the body forming portion 110 of the sacrificial core 102. As also seen in FIG. 12, the first and second manifold forming portions 104 and 106 are preferably joined by a connecting section 112 for ease in molding of the sacrificial core 102 and to add structural strength to the sacrificial core 102 before the forming material is deposited thereon since the discrete microchannel body forming portions 108 are very fragile as compared to the plate-like body forming structures of the embodiments above. Of course, such a connecting section can just as easily and beneficially be used with the sacrificial cores of the above described embodiments. In any case, the connecting section 112 is preferably treated or masked so as not to be deposited with forming material during the deposition step.

FIG. 13A illustrates one possible cross-section taken along 13-13 in FIG. 12, wherein the discrete microchannel body forming portions 108 have circular cross-sections. FIG. 13B is a view similar to that of FIG. 13A except that the cross-sectional shape of each of the discrete microchannel body forming portions 108, is hexagonal. FIG. 13C illustrates yet another possible cross-sectional configuration of the discrete microchannel body forming portions 108,, as a slightly rounded tetrahedron. It is understood that many different cross-sectional variations are contemplated and can be used in accordance with the present invention with the above specific examples illustrating only a few of the possibilities. The cross-sectional shapes being limited primarily by the ability to mold the sacrificial core. However, the deposition technique may also otherwise limit such shapes.

Moreover, with this embodiment as well as those described above, the flow transition from the manifold to microchannelled body can be advantageously contoured to minimize pressure drop. Furthermore, the use of the process of the present invention does not limit the channels or manifolds to straight lines or constant cross-sections. A variable cross-sectional channel could be used to increase or decrease heat transfer coefficients as the temperature difference decrease or increases, or the cross-sections of the microchannels can be designed to concentrate heat transfer at specific areas of heat generation while reducing fluid pressure drop.

Referring now to FIGS. 14A, 14B and 14C, the discrete microchannel body forming portions 108, 108, and 108,, shown in FIGS. 13A, 13B and 13C, respectively, are deposited with forming material to provide a heat exchanger body 114,114' or 114" of a unitary heat exchanger having microchannel passages 116, 116' or 116" with cross-sectional shapes determined by the cross-sections of the discrete microchannel body forming portions 108, 108' or 108". Note that as the heat exchanger body 114 is formed by deposition about the microchannel body forming portions 108, 108' or 108", the forming material may eventually grow together as the deposited layer is thickened to make a unitary heat exchanger body 114, 114' or 114" encompassing all of the discrete microchannel passages 116, 116' or 116".

Moreover, deposition can be conducted long enough to build up such a unitary heat exchanger body having a block appearance. Additionally, the surfaces of the body thereof can be machined or otherwise finished to provide substantially planar surfaces. Otherwise, the deposition could be controlled as well as the spacing between the microchannel body forming portions 108 so that after deposition the heat exchanger body comprises spaced discrete body portions containing microchannels without connection along their longitudinally edges. Such an open spaced heat exchanger body would be useful in a fluid-to-fluid heat exchange environment.

In a similar sense as that shown in FIGS. 12-14, the sacrificial core 102 may include discrete microchannel forming portions 108 that comprise filaments, yarns, wires or the like that can be melted, dissolved or decomposed in accordance with the method of the present invention. Such filaments could be strong between the manifold forming portions 104 and 106. Moreover, the filaments can be structured or twisted to produce desired flow characteristics.

Another configuration for a sacrificial core 118 is illustrated in FIG. 15. This sacrificial core 118 will produce a truncated conical heat exchanger of the type similar to that of the FIGS. 1-4, 5-8 and 9-11 embodiments in that the heat exchanger would include a heat exchanger body comprising two spaced plates separated from one another through which heat exchanger fluid passes. Preferably also, such a sacrificial core 118 is also provided with a pattern of through holes 120 defined by internal surfaces 122. In the same sense as the aforementioned embodiments, during the deposition step, the forming material fills the through holes 120 to form posts connected between the spaced plates of the heat exchanger body.

It is further contemplated that a manifold forming portion could be provided with the sacrificial core 118 to extend longitudinally, circumferentially along one edge or an intermediate portion, or may be provided as a plate at one of the sides. This embodiment exemplifies the many possibilities for shapes of heat exchangers which are to be customized for a specific use. Such advantageously allows heat exchangers to be designed to fit very nearly against components of complex geometries or to be used in environments requiring such complex shapes.

For example, the heat exchanger body could be formed to include stepped portions which correspond to and follow the levels of a variety of components, such as electronic components of different sizes mounted on a circuit board. Thus, each portion could intimately contact a component of a different size.

Thus, it is clear that many different geometries are possible in the formation of a heat exchanger in accordance with the present invention, such geometries being primarily limited by the ability to form a sacrificial core in that way. Furthermore, manifolds can be integrally made with such complex geometries and can also be custom made for a specific situation. That is, one or more manifolds can be provided and the positions thereof on the sacrificial core can be formed as needed. For instance, even with a substantially planar type heat exchanger body, as in FIG. 3, the manifold could be provided centrally of the heat exchanger body, along one edge, two edges or more, or a combination thereof.

Additionally, the materials used to form the unitary heat exchanger can comprise any material which can be deposited about the sacrificial core, which is strong enough to handle the pressures associated with the heat exchanger, and which is capable of maintaining its structural integrity during the step of removing the sacrificial core by melting, dissolving, decomposition, or the like. Preferable materials include nickel and copper which are easily electrochemically applied by either electroless plating or electroplating as described above and have good thermal conductivity properties.

It is also contemplated to apply forming materials in layers which can be chosen depending on the circumstances and environment of the application for a specific heat exchanger. For example, it might be desirable to first deposit a layer of nickel onto the sacrificial core because of its strength and corrosion resistant properties with certain fluids, and then to deposit copper as the remainder of the body to take advantage of its better heat conductivity. Such controlled deposition can easily be accomplished by electroplating.

Thus, the scope of the present invention should not be limited to the structures described by the plural embodiments of this application, but only by the limitations of the appended claims.

We claim:

1. A method of making a unitary heat exchanger to be connected with a first fluid circulation system, the unitary heat exchanger including a first manifold connectible to the first fluid circulation system and a heat transfer body fluidically connected to the manifold, the method comprising the steps of:
   (a) forming a sacrificial core with a first manifold forming portion and a sheet-like body forming portion, the manifold forming portion being connected to the body forming portion along an edge thereof;
   (b) depositing heat exchanger forming material about the sacrificial core for at least partially surrounding and forming a shell about the sacrificial core, said deposition step thereby integrally making the first manifold connected with opposed spaced plates of the body of the unitary heat exchanger;
   (c) providing an access opening through the shell including the manifold and the body of the unitary heat exchanger so as to provide access to the sacrificial core from outside the shell; and
   (d) removing the sacrificial core from within the shell of the unitary heat exchanger through the access opening, thereby leaving a passage within the manifold that opens into a passage formed between the spaced plates of the body of the unitary heat exchanger.

2. The method of claim 1, further including the step of providing an internal surface on the body forming portion for defining at least one hold through the body forming portion of the sacrificial core before said step of depositing the heat exchanger forming material, wherein, during said deposition step, the heat exchanger forming material is also deposited onto the internal surface of the body forming portion thereby creating a post of heat exchanger forming material connecting opposite sides of the shell.

3. The method of claim 2, wherein said step of making the at least one hole takes place within said step of formation of the sacrificial core.

4. The method of claim 2, wherein said deposition step further includes controlling the thickness of deposition of heat exchanger forming material with respect to the dimensions of the internal surface of the hole so that an aperture passing through the post remains after said deposition step is complete.

5. The method of claim 2, including providing a plurality of internal surfaces on the body forming portion for defining a like plurality of holes through the body forming portion of the sacrificial core, wherein, during said deposition step, the heat exchanger forming material is also deposited onto each of the internal surfaces of the body forming portion thereby creating a like plurality of posts of heat exchanger forming material connecting opposite sides of the shell.

6. The method of claim 5, wherein said step of making the plurality of holes takes place within said step of formation of the sacrificial core.

7. The method of claim 5, wherein said deposition step further includes controlling the thickness of deposition of heat exchanger forming material with respect to the dimensions of at least one of the internal surfaces of the holes so that at least one aperture passing through a post remains after said deposition step is complete, the at least one apertured post providing a fluid flow path for a second fluid circulation system, thereby facilitating heat exchange between the fluids of the first and second circulation systems.

8. The method of claim 5, wherein said step of providing the plurality of internal surfaces on the body forming portion defining the plurality of holes comprises providing internal surfaces defining holes through the body forming portion of the sacrificial core of at least two different size dimensions, thus providing a first set of holes that form a first set of posts during said deposition step and a second larger set of holes that form a second set of apertured posts during said deposition step, the second set of apertured posts providing a fluid flow path for a second fluid circulation system, thereby facilitating heat exchange between the fluids of the first and second circulation systems.

9. The method of claim 5, wherein said step of providing the plurality of internal surfaces on the body forming portion defining the plurality of holes comprises providing internal surfaces defining holes through the body forming portion of the sacrificial core of at least two different size dimensions, thus providing a first set of holes that form a first set of closed posts during said deposition step and a second larger set of holes that form a second set of apertured posts during said deposition step, the second set of apertured posts providing mounting holes and lead holes for mounting a component to the unitary heat exchanger.

10. The method of claim 1, wherein said step of forming the sacrificial core includes forming the body forming portion with a plurality of discrete body forming elements which extend from the first manifold forming portion, and, after said step of depositing the heat exchanger forming material and said step of removing of the sacrificial core, a plurality of channels are defined within the body of the unitary heat exchanger extending from the first manifold of the unitary heat exchanger.

11. The method of claim 10, wherein said step of forming the sacrificial core further includes forming the sacrificial core with a second manifold forming portion connected with the discrete body forming elements at ends thereof distal to the first manifold forming portion, and, after said step of depositing heat exchanger forming material and said step of removing the sacrificial core, the plurality of channels are defined extending between the first manifold and a second manifold of the unitary heat exchanger.

12. The method of claim 10, further including providing filaments strung between the first and second manifold forming portions as the discrete body forming elements.

13. The method of claim 1, wherein said step of forming the sacrificial core further includes forming the sacrificial core with a second manifold forming portion connected with an edge of the body forming portion distal to the first manifold forming portion, and, after said step of depositing the heat exchanger forming material and said step of removing the sacrificial core, the body of the unitary heat exchanger is defined extending between the first manifold and a second manifold of the unitary heat exchanger.

14. The method of claim 1, wherein said step of depositing the heat exchanger forming material comprises electrochemical deposition, said sacrificial core is formed of one of a wax, plastic and fusible alloy having a softening temperature lower than that of the heat exchanger forming material, and said step of removing the sacrificial core comprises melting the sacrificial core and allowing the molten sacrificial core to flow out of the access opening.

15. The method of claim 1, wherein said step of forming the sacrificial core further comprises forming the body forming portion substantially planar.

16. The method of claim 1, wherein said step of forming the sacrificial core further comprises structuring at least a portion of an external surface of the body forming portion of the sacrificial core for providing a corresponding structured internal surface on the body of the unitary heat exchanger.

17. The method of claim 1, wherein said step of removing the sacrificial core comprises decomposing the sacrificial core.

18. The method of claim 1, wherein said step of removing the sacrificial core comprises dissolving the sacrificial core.

19. A method of making a unitary heat exchanger to be connected with a first fluid circulation system, the unitary heat exchanger including a heat transfer body connectible to the first fluid circulation system, said method comprising the steps of:
(a) forming a sacrificial core with a sheet-like body forming portion;
(b) providing an internal surface on the body forming portion of the sacrificial core for defining at least one hole through the body forming portion of the sacrificial core;
(c) depositing heat exchanger forming material about the sacrificial core for at least partially surrounding and forming a shell about the sacrificial core, said deposition step thereby integrally creating the body of the unitary heat exchanger comprising opposed spaced plates, and at the same time depositing the heat exchanger forming material onto the internal surface of the body forming portion thereby creating a post of heat exchanger forming material connecting the opposed spaced plates of the shell, wherein said deposition step further includes controlling the thickness of deposition of heat exchanger forming material with respect to the dimensions of the internal surface of the hole so that an aperture passing through the post remains after said deposition step is complete;
(d) providing an access opening through the shell making the body of the unitary heat exchanger so as to provide access to the sacrificial core from outside the shell; and
(e) removing the sacrificial core from within the unitary heat exchanger through the access opening, thereby leaving a passage within the body of the unitary heat exchanger through which fluid of the first circulation system can pass.

20. The method of claim 19, wherein said step of providing the internal surface on the body forming portion for defining the at least one hole through the body forming portion takes place within said step of formation of the sacrificial core.

21. The method of claim 1, wherein said step of forming a sacrificial core further includes forming the sheet-like body forming portion with a substantially uniform thickness so that after said deposition step, the opposed spaced plates of the body of the unitary heat exchangers are substantially evenly spaced from one another.

22. The method of claim 19, wherein step (b) includes providing a plurality of internal surfaces on the body forming portion for defining a plurality of holes through the body forming portion of the sacrificial core, wherein, during said deposition step, the heat exchanger forming material is deposited onto each of the internal surfaces of the body forming portion thereby creating a like plurality of posts of heat exchanger forming material connecting opposite sides of the shell.

23. The method of claim 22, wherein said step of providing a plurality of internal surfaces on the body forming for defining the plurality of holes through the body forming portion takes place within said step of formation of the sacrificial core.

24. The method of claim 19, wherein said step of forming a sacrificial core further includes forming the sheet-like body forming portion with a substantially uniform thickness so that after said deposition step, the opposed spaced plates of the body of the unitary heat exchangers are substantially evenly spaced from one another.

25. The method of claim 22, wherein said step of providing the plurality of internal surfaces on the body forming portion for defining the plurality of holes through the body forming portion comprises providing internal surfaces defining holes through the body forming portion of the sacrificial core of at least two different size dimensions, thus providing a first set of holes that form a first set of posts during said deposition step and a second larger set of holes that form a second set of larger apertured posts during said deposition step, the second set of apertured posts providing a fluid flow path for a second fluid circulation system, thereby facilitating heat exchange between the fluids of the first and second circulation systems.

26. The method of claim 22, wherein said step of providing the plurality of internal surfaces on the body forming portion for defining the plurality of holes through the body forming portion comprises providing internal surfaces defining holes through the body forming portion of the sacrificial core of at least two different size dimensions, thus providing a first set of holes that form a first set of posts during said deposition step and a second larger set of holes that form a second set of larger apertured posts during said deposition step, the second set of apertured posts providing mounting holes and lead holes for mounting a component to the unitary heat exchanger.

27. The method of claim 19, wherein said step of depositing the heat exchanger forming material comprises electrochemical deposition, said sacrificial core is formed of one of a wax, plastic and fusible alloy having a softening temperature lower than that of the heat exchanger forming material, and said step of removing the sacrificial core comprises melting the sacrificial core and allowing the molten sacrificial core to flow out of the access opening.

28. The method of claim 19, wherein said step of forming the sacrificial core further comprises forming the body forming portion substantially planar.

29. The method of claim 19, wherein said step of forming the sacrificial core further comprises structuring at least a portion of an external surface of the body forming portion of the sacrificial core for providing a corresponding structured internal surface on the body of the unitary heat exchanger.

30. The method of claim 19, wherein said step of removing the sacrificial core comprises decomposing the sacrificial core.

31. The method of claim 19, wherein said step of removing the sacrificial core comprises dissolving the sacrificial core.

* * * * *